(12) United States Patent
Donig

(10) Patent No.: US 7,336,126 B2
(45) Date of Patent: Feb. 26, 2008

(54) SUBTRACTOR CIRCUIT AND POWER DETECTOR ARRANGEMENT HAVING THAT SUBTRACTOR CIRCUIT

(75) Inventor: Günter Donig, Poing (DE)

(73) Assignee: Infineon Technologies AG, Munich (DE)

(*) Notice: Subject to any disclaimer, the term of this patent is extended or adjusted under 35 U.S.C. 154(b) by 245 days.

(21) Appl. No.: 11/172,095

(22) Filed: Jun. 30, 2005

(65) Prior Publication Data

US 2006/0017499 A1    Jan. 26, 2006

Related U.S. Application Data

(63) Continuation of application No. PCT/DE03/04198, filed on Dec. 18, 2003.

(30) Foreign Application Priority Data

Jan. 2, 2003 (DE) ................ 103 00 011

(51) Int. Cl.
*H03F 3/45* (2006.01)
(52) U.S. Cl. .................. 330/69; 330/252
(58) Field of Classification Search .......... 330/69, 330/252, 257, 260, 261
See application file for complete search history.

(56) References Cited

U.S. PATENT DOCUMENTS

| | | | |
|---|---|---|---|
| 3,500,223 A | * | 3/1970 | Thurnell .................. 330/254 |
| 3,980,966 A | * | 9/1976 | Gieck et al. .............. 330/69 |
| 6,346,855 B1 | | 2/2002 | Seevinck |
| 6,373,236 B1 | | 4/2002 | Lemay, Jr. et al. |
| 6,417,729 B1 | | 7/2002 | Lemay et al. |
| 6,459,254 B1 | | 10/2002 | Mazzochette et al. |
| 7,042,284 B2 | * | 5/2006 | Moons et al. .............. 330/69 |
| 2002/0167344 A1 | | 11/2002 | Zha et al. |

FOREIGN PATENT DOCUMENTS

| | | |
|---|---|---|
| DE | 35 39 214 A1 | 5/1986 |
| DE | 689 19 764 T2 | 5/1995 |
| WO | WO 02/103375 A2 | 12/2002 |
| WO | WO 02/103898 A1 | 12/2002 |

OTHER PUBLICATIONS

International Search Report, Int'l Filing No. PCT/DE03/04198, Int'l Filing Date Dec. 18, 2003, 3 pgs.
Halbleiter-Schaltungstechnik, U. Tietze and Ch. Schenk, 1986, 8 Auflage, Springer-Verlag, pp. 301-304.

* cited by examiner

*Primary Examiner*—Henry Choe
(74) *Attorney, Agent, or Firm*—Eschweiler & Associates, LLC

(57) ABSTRACT

A subtractor circuit which provides, at an output, a signal that is proportional to the difference, which is applied to the input, between two signal levels is specified. Formed at the output of an operational amplifier of the subtractor circuit are two synchronous signal sources, one of which is used for feedback from one of the two identical outputs to an input of the operational amplifier. In accordance with the proposed principle, a feedback resistor which is normally present in analog subtractor circuits is avoided. The altered voltage swing at the output of the operational amplifier makes it possible to operate the latter without a negative supply voltage. The subtractor circuit described is particularly suited to power detection using an input-side power detector.

17 Claims, 3 Drawing Sheets

SUBTRACTOR CIRCUIT AND POWER DETECTOR ARRANGEMENT HAVING THAT SUBTRACTOR CIRCUIT

REFERENCE TO RELATED APPLICATIONS

This application is a continuation of PCT/DE03/04198, filed Dec. 18, 2003 which was not published in English, that claims the benefit of the priority date of German Patent Application No. DE 103 00 011.9, filed on Jan. 2, 2003, the contents of which both are herein incorporated by reference in their entireties.

FIELD OF THE INVENTION

The present invention relates to a subtractor circuit and to a power detector arrangement with that subtractor circuit.

BACKGROUND OF THE INVENTION

Subtractors are normally designed in such a manner that an output voltage which is proportional to a differential voltage is emitted. In this case, the differential voltage results from the difference between two input voltages which are applied to the input of the circuit. The proportionality factor is dependent on the design of the circuit, for example on the gain factor of an amplifier which is used.

High-precision mathematical operations can be carried out using digital computers. However, since the variables to be processed are frequently in the form of continuous signals, for example in the form of an electrical voltage that is analogous to a measurement variable, complex analog/digital converters would have to be provided at the input of digital computers of this type and digital/analog converters would in turn have to be provided at the output of the digital computers. However, this outlay is only worthwhile when a particularly high degree of precision is required.

It goes without saying that it is also alternatively possible to carry out the desired operation using an analog circuit.

A subtractor circuit designed using analog circuit technology needs to be added to the analog computing circuits. By way of example, the document Tietze, Schenk: Halbleiter-Schaltungstechnik [Semiconductor circuit technology], 11th edition, page 771, indicates, in FIG. 11.3, a subtractor of analog design which uses an operational amplifier. In this case, the operational amplifier is connected in a negative feedback path, a resistor coupling the output of the operational amplifier to the inverting input of the latter. The input voltages, the difference between which is to be formed, are supplied to the two inputs of the operational amplifier via respective resistors. The non-inverting input of the operational amplifier is connected to ground via a further resistor.

A classic subtractor circuit of this type having only one operational amplifier operates as an inverting amplifier and provides negative output voltages. A negative supply voltage is needed to operate the operational amplifier.

However, negative supply voltages are not available in every integrated circuit technology or in every integrated circuit application or could additionally be provided only with an impermissibly high outlay.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention discloses a subtractor circuit with a power detector arrangement which do not require a negative supply voltage.

In accordance with an aspect of the present invention, a subtractor circuit is disclosed. The circuit comprises a first signal input for supplying a first signal, a second signal input for supplying a second signal which is to be subtracted from the first, and an operational amplifier. The operational amplifier has a first input which is coupled to the first signal input, a second input which is coupled to the second signal input, a first output which is designed to provide a differential signal in a manner dependent on the first and second signals and which forms a signal output of the subtractor circuit, and a second output which is likewise designed to provide the differential signal and which is connected to the first input of the operational amplifier in a feedback path.

In accordance with the proposed principle, the operational amplifier which is connected so as to form a subtractor does not only have one output (as usual) but rather two signal outputs. In this case, the two outputs of the operational amplifier are, in principle, identically designed as synchronous signal sources, that is to say that a signal which is proportional to the signal difference between the first and second signals at the input can be respectively tapped off at the two outputs of the operational amplifier.

The need for a feedback resistor (which is usually provided in subtractors of analog design) between the output and the inverting input of the operational amplifier is thereby avoided. Rather, in accordance with the present principle, an output current can be tapped off at the second output of the operational amplifier and fed back. Avoiding the feedback resistor changes the voltage swing at the second output of the operational amplifier and thus makes it possible to dispense with the negative supply voltage. Accordingly, the operational amplifier manages without a negative supply voltage.

Whereas the voltage at the useful output of the operational amplifier, that is to say at the first output of the operational amplifier, varies, the voltage at the second, feedback output of the operational amplifier is always constant.

In accordance with one development of the proposed principle, the second output of the operational amplifier is directly and permanently connected to the first input of the operational amplifier so as to form a current feedback path.

A cascode circuit can be provided at the signal output of the subtractor circuit. The cascode circuit avoids or mtigates the undesirable Early effect at the signal output of the subtractor circuit.

As regards the power detector arrangement, this achieved by means of a power detector arrangement having a subtractor circuit as described above, in which provision is made for the output of a power detector to be coupled to the first input of the operational amplifier. The power detector associates a radio-frequency (RF) signal which is applied to its input with an output signal which represents the power level of the RF signal at the input. The power detector may, for example, be in the form of a so-called diode detector.

The output of a power detector which associates a signal which has a constant power level and is applied to its input with an output-side reference signal (which is likewise constant) and supplies it to the second input of the operational amplifier can be likewise connected to the second input of the operational amplifier, said input optionally being in the form of a reference signal input. Relating a power level (which is to be determined) of a radio-frequency signal to a reference level by providing two identically designed power detectors at respective inputs of a subtractor circuit results in the power detection circuit being independent of temperature drifts and fabrication-dictated variations in production parameters. In addition, this also provides frequency response compensation.

The resistors which respectively connect the output of the power detector to the first or second input of the operational amplifier optionally have the same resistance. Since the resistors determine the current which respectively flows into the operational amplifier at the inputs of the latter, resistors of exactly the same size free the circuit from offsets.

The voltage level at the second input of the operational amplifier is optionally constantly about 0.5 V, while the voltage level at the output of the power detector at the first input of the operational amplifier typically varies between 0.5 V and 2 V.

A current-controlled voltage source which associates the signal difference that is determined by the subtractor with an output voltage that is proportional to said signal difference is, in one example, coupled to the first output of the operational amplifier, the useful output of the subtractor circuit.

The current-controlled voltage source is typically connected to the first output of the operational amplifier via a current mirror. As a result, the output voltage is related to ground instead of to the supply voltage.

In accordance with another aspect of the present invention, a subtractor circuit is disclosed. The subtractor circuit comprises a first power detector, a second power detector, and an operational amplifier. The first power detector receives a radio frequency signal and generates a first signal having a first voltage level according to a power level of the radio frequency signal. The second power detector generates a second signal having a constant voltage level according to a ground reference value. The power amplifier comprises a first input, a second input, a first output, and a second output. The first input receives the first signal and a feedback signal. The second input receives the second signal. The first output generates the feedback signal according to the first signal and the second signal. The second output generates a differential output signal according to the first signal and the second signal.

BRIEF DESCRIPTION OF THE DRAWINGS

The invention will be explained in more detail below using an exemplary embodiment and with reference to drawings, in which.

DETAILED DESCRIPTION OF THE INVENTION

Figure 1:
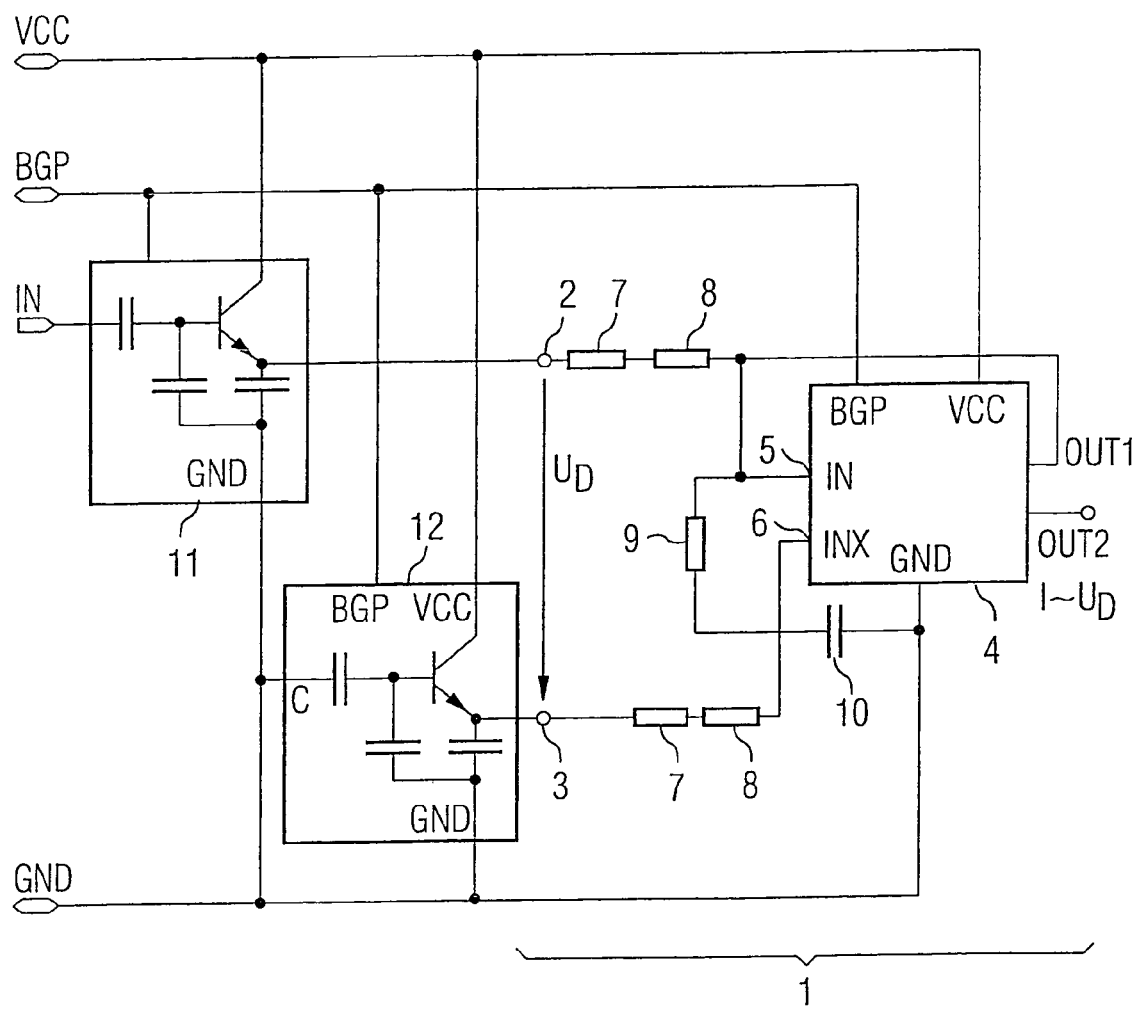
FIG. 1 shows an exemplary embodiment of a circuit diagram of a power detector having the subtractor circuit in accordance with the proposed principle.

One or more implementations of the present invention will now be described with reference to the attached drawings, wherein like reference numerals are used to refer to like elements throughout, and wherein the illustrated structures are not necessarily drawn to scale.

FIG. 1 shows a power detector arrangement having a subtractor circuit 1. The subtractor circuit 1 has a first signal input 2 for supplying a first signal and a second signal input 3 for supplying a second signal which is to be subtracted from the first signal. A differential voltage $U_D$ which is to be determined is applied between the signal inputs 2, 3.

The subtractor circuit 1 also comprises an operational amplifier 4 having a first input 5 which is coupled to the first signal input 2 and a second input 6 which is coupled to the second signal input 3. The operational amplifier has two outputs OUT1, OUT2 having synchronous current sources, the first output OUT2 of which forms the signal output of the subtractor 1 and the second output OUT1 of which is directly connected to the first input 5 of the operational amplifier. The inputs 5, 6 of the operational amplifier are usually also referred to as the inverting and non-inverting input.

In order to couple the signal inputs 2, 3 of the subtractor circuit to the inputs 5, 6 of the operational amplifier, provision is made of a respective series circuit comprising two resistors 7, 8 which are the same size in the two input current branches formed thereby. Identical resistors are provided with identical reference symbols. The subtractor circuit finally comprises a series circuit comprising a resistor 9 and a capacitor 10, said series circuit connecting the first input 5 of the operational amplifier to a reference potential terminal GND of the subtractor. The operational amplifier 4 is connected, for its power supply, to a supply potential terminal VCC and is additionally connected to a reference signal terminal BGP. The output of a power detector 11, 12 is respectively connected to the signal inputs 2, 3 of the subtractor circuit 1. For their supply, the power detectors 11, 12 are connected to the supply potential terminal VCC, the reference signal terminal BGP and the reference potential terminal GND.

At its input, the first power detector 11 forms the actual useful signal input (having the reference symbol IN) of the power detector arrangement of FIG. 1 and, at its output, it associates the power level of a radio-frequency signal that is applied to its input with a voltage value that is between 0.5 V and 2 V and is proportional to the power of the RF signal. In contrast, the input of the second power detector 12 is permanently connected to the reference potential GND and provides a constant level of 0.5 V at its output.

Since the power detectors 11, 12 are of identical design, temperature drifts, production-dictated parameter variations, frequency response dependencies etc. are automatically compensated for.

The outputs OUT1, OUT2 of the operational amplifier both provide a current signal which is proportional to the differential voltage $U_D$ between the signal inputs 2, 3 of the subtractor circuit. Avoiding a feedback resistor between the output OUT1 and the input 5 of the operational amplifier and thus reducing the voltage swing at the output of the operational amplifier makes it possible, using the proposed principle, to manage without a negative supply voltage for the operational amplifier.

The output voltage of the operational amplifier is not fed back via a feedback resistor (as is usually customary in subtractor circuits) but rather an output current is generated and fed back. This current source can operate with the existing voltage swing of 0.5 V. The principle of this subtractor involves splitting the output stage of the operational amplifier 4 into two synchronous current sources, one of which is used for feedback to the input and the other of which provides the actual output variable, a current which is proportional to the differential voltage $U_D$.

A current which is proportional to the power level of a radio-frequency signal that is applied to the input IN of the power detector 11 is therefore provided at the signal output OUT2.

Figure 2:
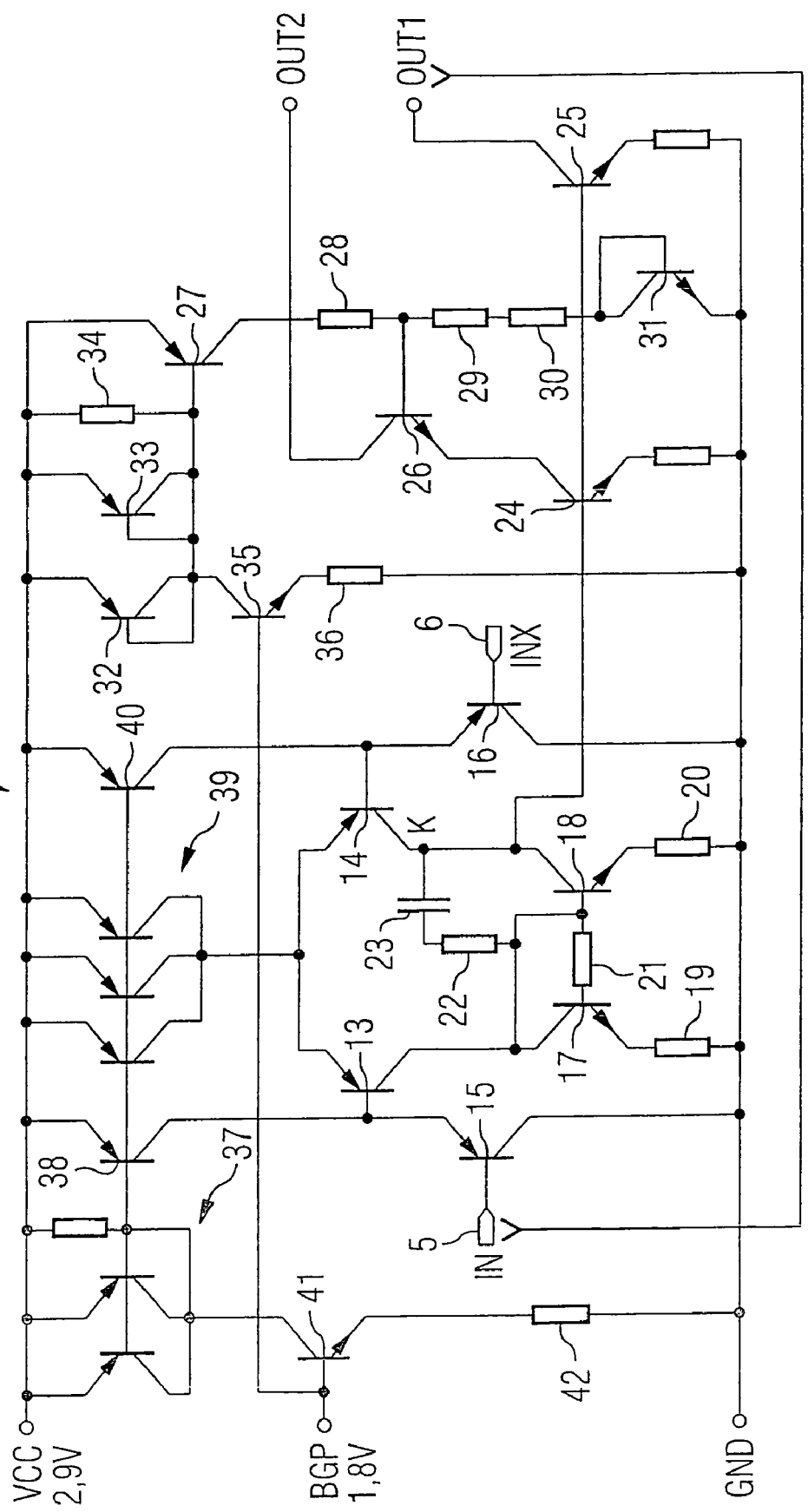
FIG. 2 uses a circuit diagram of the operational amplifier of FIG. 1 to show an exemplary embodiment of a subtractor circuit in accordance with the present principle.

FIG. 2 uses a circuit diagram to show an exemplary embodiment of the operational amplifier 4 of FIG. 1. The actual core of the operational amplifier is formed by two emitter-coupled transistors 13, 14 which are connected in the form of a differential amplifier and the base terminals of which are connected to the inputs 5, 6 of the operational amplifier via a respective transistor in a common collector connection. In this case, the transistors in a common collector connection are provided with the reference symbols 15, 16. The collector terminals of the operational amplifier transistors 13, 14 are connected to the reference potential terminal GND via a respective further transistor 17, 18 and a respective emitter resistor 19, 20. The base terminal of the transistor 17 is connected, via a resistor 21, to the base terminal of the transistor 18 so as to form a current mirror, and, in addition, the collector terminal of the transistor 17 is connected to the base terminal of the transistor 17 via the resistor 21. Furthermore, the collector terminal of the transistor 17, and thus the base terminal of the transistor 18 as well, are connected, via a series circuit comprising a resistor 22 and a capacitor 23, to the collector terminal of the transistor 14 at which the output node K of the differential amplifier 13, 14 is formed.

The node K is connected to the two synchronous outputs OUT1, OUT2 of the operational amplifier 4 via a respective output stage. For this purpose, provision is made of a respective transistor 24, 25 having a respective resistor in its emitter path, said resistor respectively connecting the emitter terminal to the reference potential terminal GND. Whereas the collector terminal of the transistor 24 is connected to the first output OUT2 via a cascode transistor 26, the collector terminal of the transistor 25 directly forms the output OUT1 which, in accordance with the present principle, is connected in a current feedback path to the input 5. In order to drive the base terminal of the cascode transistor 26, a series circuit comprising a transistor 27, resistors 28, 29, 30 and a diode transistor 31 is formed between the supply potential terminal VCC and the reference potential terminal GND, the base terminal of the transistor 26 being connected between the resistors 28, 29.

A parallel circuit comprising two bipolar diodes 32, 33 and a resistor 34 is provided for the purpose of driving the base terminal of the transistor 27. A series circuit comprising a transistor 35 and a resistor 36 connects the base terminal of the transistor 27 to ground GND. The base terminal of the transistor 35 is connected to the reference potential terminal BGP.

Depending on the signal which is applied to the reference terminal BGP, the currents are delivered to the input transistors 15, 16 of the operational amplifier and to the differential amplifier transistors 13, 14 via respective current mirrors 37, 38, 39, 40. In this case, the emitters of the current mirror transistors 37, 38, 39, 40 are connected to one another and to the supply potential terminal VCC. The diode transistors 37 at the input of the current mirror are driven using a transistor 41 to whose base terminal the reference voltage terminal BGP is connected and whose emitter terminal is connected to ground via a resistor 42. The collector terminal of the transistor 41 is connected to the input 37 of the current mirror. The collector terminal of the transistor 38, which forms the output of a current mirror, is connected to the emitter terminal of the input transistor 15 of the operational amplifier and, in a manner analogous to this, the collector terminal of the transistor 40, which forms the output of a current mirror, is connected to the emitter terminal of the input transistor 16 of the operational amplifier. The collector terminals of the transistors 39 of a current mirror are connected to the common emitter node of the differential amplifier 13, 14.

Apart from the cascode stage 26, the outputs OUT1, OUT2 of the operational amplifier 4 (which is designed using bipolar circuit technology) are of identical design and form two synchronous current sources which respectively provide a current signal that is proportional to the differential voltage $U_D$ at the input 2, 3 of the subtractor.

Figure 3:
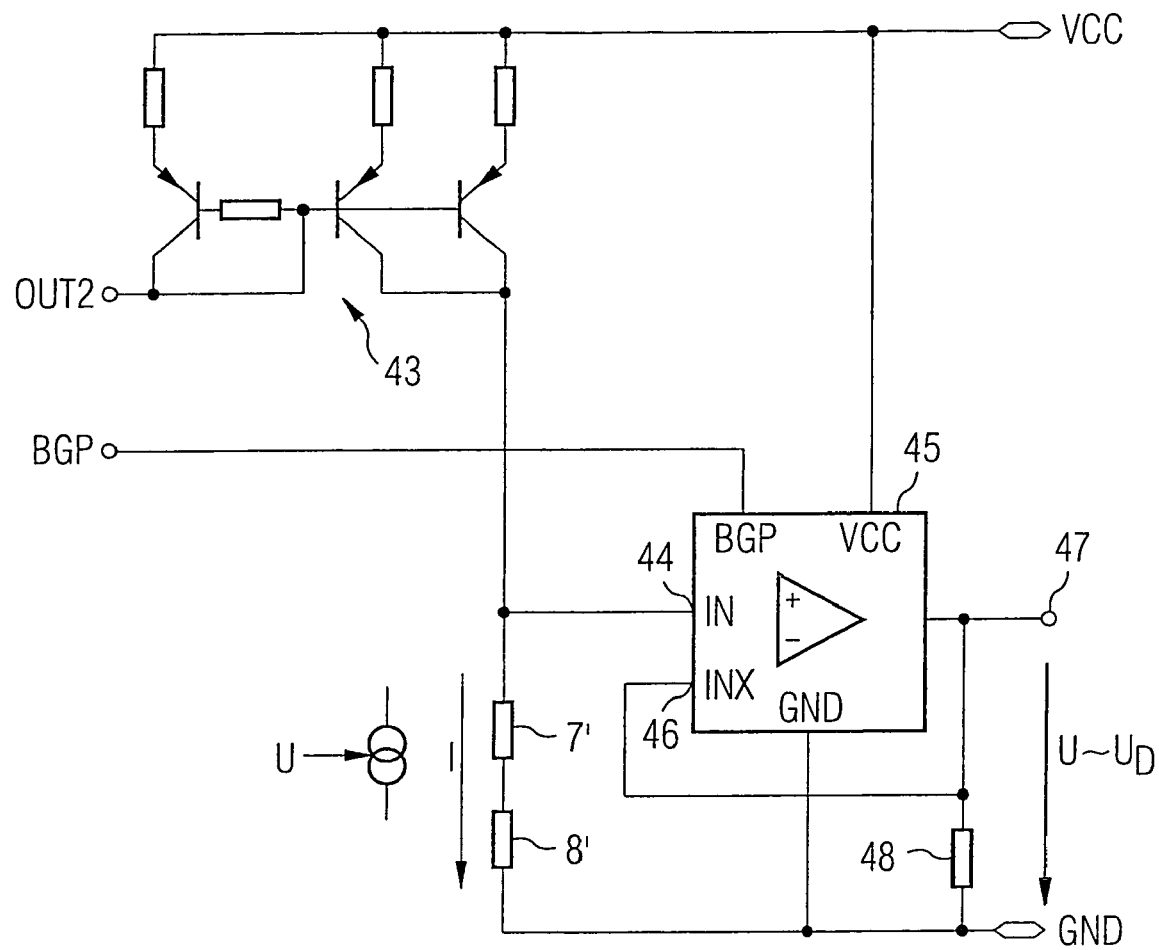
FIG. 3 uses an exemplary circuit diagram to show a circuit for processing the output signal which is provided by the operational amplifier shown in FIG. 2.

FIG. 3 shows a circuit which can be connected to the output OUT2 of the operational amplifier 4 of FIG. 2 and which associates the output current of the operational amplifier 4 with a voltage U that is proportional to the differential voltage $U_D$ at the input of the subtractor circuit of FIG. 1.

The output OUT2 of the operational amplifier 4 is connected to a first input 44 of a further operational amplifier 45 via a current mirror 43. The first input 44 of the further operational amplifier 45 is connected to the reference potential GND via two resistors 7', 8'. The output of the further operational amplifier 45 is directly and permanently connected to a second input 46 of the operational amplifier and simultaneously forms the output 47 of the entire circuit. This output 47 is connected to the reference potential GND via a resistor 48.

In the present exemplary embodiments, the supply voltage is 2.9 V and the reference voltage is 1.8 V, respectively.

The resistors 7', 8' should be matched, as well as possible, to the resistors 7, 8 at the inputs 5, 6 of the operational amplifier 4 of FIG. 1. The resistors 7', 8' give rise to current/voltage conversion. Accordingly, the output current at the output OUT2 of the operational amplifier 4 is converted, via the current mirror 43 and the resistors 7', 8', into a voltage U which is available, via the buffer amplifier 45, as the output voltage. In this case, the current mirror 43 relates the output voltage to the reference potential. The output voltage at the output 47 is exactly proportional to the differential voltage $U_D$ at the inputs 2, 3 of the subtractor circuit 1.

It goes without saying that it is within the scope of the invention to also use the subtractor circuit in accordance with the proposed principle in applications other than power detection.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

LIST OF REFERENCE SYMBOLS

1 Subtractor circuit
2 Signal input
3 Signal input
4 Operational amplifier
5 Input
6 Input
7 Resistor
8 Resistor
9 Resistor
10 Capacitor
11 Power detector
12 Power detector
13 Transistor
14 Transistor
15 Transistor
16 Transistor
17 Transistor
18 Transistor
19 Resistor
20 Resistor
21 Resistor
22 Resistor
23 Capacitor
24 Transistor
25 Transistor
26 Cascode transistor
27 Transistor
28 Resistor
29 Resistor
30 Resistor
31 Diode
32 Diode
33 Diode
34 Resistor
35 Transistor
36 Resistor
37 Diode
38 Transistor
39 Transistor
40 Transistor
41 Transistor
42 Resistor
43 Current mirror
44 Input
45 Buffer amplifier
46 Input
47 Output
48 Resistor
OUT1 Output
OUT2 Output
IN Input
U Output voltage
$U_D$ Differential voltage
BGP Reference voltage
VCC Supply potential terminal
GND Reference potential terminal

What is claimed is:

1. A subtractor circuit comprising:
a first signal input to receive a first signal;
a first signal path coupled to the first signal input;
a second signal input to receive a second signal;
a second signal path coupled to the second signal input; and
an operational amplifier comprising:
a first input coupled to the first signal path to receive the first signal;
a second input coupled to the second signal path to receive the second signal;
a first output that provides a subtractor signal output that is a function of a difference between the first signal and the second signal; and
a second output connected to the first input via a feedback path that provides the subtractor signal output as a feedback signal to the first input.

2. The circuit of claim 1, wherein the feedback path comprises a direct connection from the second output to the first input as a current feedback path.

3. The circuit of claim 1, further comprising a cascade circuit coupled to the first output of the operational amplifier that receives the subtractor signal output.

4. The circuit of claim 1, further comprising a power detector having an input that receives a radio-frequency signal and having an output coupled to the first signal input that provides the first signal dependent on a power level of the radio-frequency signal.

5. The circuit of claim 4, further comprising a second power detector having an output coupled to the second signal input that provides the second signal as a reference signal having a constant level.

6. The circuit of claim 5, wherein the first signal path comprises a first resistor and a second resistor, connected in series and having substantially equal resistance.

7. The circuit of claim 1, wherein the feedback path comprises a current-controlled voltage source.

8. The circuit of claim 7, wherein the current-controlled voltage sources comprises a resistor.

9. The circuit of claim 1, wherein the feedback path comprises a current mirror and a current-controlled voltage source, wherein the current-controlled voltage source is connected to the first output of the operational amplifier via the current mirror.

10. A subtractor circuit comprising:
a first power detector to receive a radio frequency signal and generate a first signal having a first voltage level according to a power level of the radio frequency signal;
a second power detector to generate a second signal having a constant voltage level according to a ground reference value; and
a power amplifier comprising:
a first input to receive the first signal and a feedback signal;
a second input to receive the second signal;
a first output to generate the feedback signal according to the first signal and the second signal; and
a second output to generate a differential output signal according to the first signal and the second signal.

11. The circuit of claim 10, wherein the first voltage level is about 0.5 to 2 volts.

12. The circuit of claim 11, wherein the constant voltage level is about 0.5 and a differential voltage of the first signal and the second signal is about 0.0 to 1.5 volts.

13. The circuit of claim 10, wherein the feedback signal has a current value proportional to a differential voltage of the first signal and the second signal.

14. The circuit of claim 10, wherein the differential output signal has a current proportional to a differential voltage of the first signal and the second signal.

15. The circuit of claim 14, further comprising a current conversion circuit to receive the differential output signal and convert the differential output signal into an output voltage signal, wherein the output voltage signal has a voltage level proportional to the differential voltage of the first signal and the second signal.

16. The circuit of claim 10, wherein the feedback signal and the differential output signal are as synchronous signal sources.

17. The circuit of claim 10, wherein the feedback signal has a constant voltage level and the differential output signal has a varying voltage level.

* * * * *